(12) United States Patent
Horn

(10) Patent No.: US 11,243,254 B2
(45) Date of Patent: Feb. 8, 2022

(54) METHOD FOR OPERATING A TEST APPARATUS AND A TEST APPARATUS

(71) Applicant: Advantest Corporation, Tokyo (JP)

(72) Inventor: Wolfgang Horn, Stuttgart (DE)

(73) Assignee: ADVANTEST CORPORATION, Tokyo (JP)

( * ) Notice: Subject to any disclaimer, the term of this patent is extended or adjusted under 35 U.S.C. 154(b) by 575 days.

(21) Appl. No.: 15/716,516

(22) Filed: Sep. 27, 2017

(65) Prior Publication Data
US 2018/0017620 A1 Jan. 18, 2018

Related U.S. Application Data

(63) Continuation of application No. PCT/EP2015/057273, filed on Apr. 1, 2015.

(51) Int. Cl.
*G01R 31/00* (2006.01)
*G01R 31/319* (2006.01)

(52) U.S. Cl.
CPC . *G01R 31/31907* (2013.01); *G01R 31/31917* (2013.01)

(58) Field of Classification Search
CPC .............. G01R 31/31907; G01R 31/31917
See application file for complete search history.

(56) References Cited

U.S. PATENT DOCUMENTS 5,890,119 A * 3/1999 Suzuki ............... G10H 1/0041
704/267
6,327,545 B1 12/2001 Browen et al.
6,397,160 B1 5/2002 Craig et al.
6,795,496 B1 9/2004 Soma et al.
7,240,258 B1 7/2007 Hayes
(Continued)

FOREIGN PATENT DOCUMENTS

EP 0626588 11/1994
EP 0984291 3/2000
(Continued)

OTHER PUBLICATIONS

Quintanel, S., et al., "On-Wafer Multi-Port Circuits Characterization Technique with a Two-Port VNA," IEEE 81st ARFTG Microwave Measurement Conference, Seattle, WA, Jun. 7, 2013, pp. 1-4.
(Continued)

*Primary Examiner* — Mohamed Charioui
*Assistant Examiner* — Christine Y Liao

(57) ABSTRACT

A method for operating a test apparatus including a plurality of shared resources is shown, wherein the plurality of shared resources can be used in different instruments. The method includes blocking a first set of resource blockers when a first instrument, which requires a first subset of the shared resources, is to be executed. Furthermore, the method tries to block a second set of resource blockers, when a second instrument, which requires a second subset of the shared resources, is to be executed. Therefore, the first set of resource blockers is different from the second set of resource blockers and a plurality of resource blockers are assigned to a shared resource, which is involved in a conflicting combination of instruments and in a non-conflicting combination of instruments.

20 Claims, 4 Drawing Sheets

(56) References Cited

U.S. PATENT DOCUMENTS

| | | | |
|---|---|---|---|
| 7,256,585 B1 | 8/2007 | Shoulders | |
| 7,260,184 B1 | 8/2007 | Howard et al. | |
| 7,680,619 B1 | 3/2010 | Lei | |
| 7,853,425 B1 | 12/2010 | Williamson et al. | |
| 2004/0004466 A1 | 1/2004 | Miyanaga et al. | |
| 2004/0093180 A1 | 5/2004 | Grey et al. | |
| 2005/0050546 A1 | 3/2005 | Remany et al. | |
| 2005/0068068 A1 | 3/2005 | Hall | |
| 2005/0102589 A1 | 5/2005 | Park et al. | |
| 2005/0234662 A1 | 10/2005 | Niedzwiecki et al. | |
| 2006/0195747 A1 | 8/2006 | Pramanick et al. | |
| 2007/0239915 A1* | 10/2007 | Saha | G06F 12/145 710/200 |
| 2008/0164894 A1 | 7/2008 | Kim et al. | |
| 2009/0037132 A1 | 2/2009 | Zhou et al. | |
| 2009/0079448 A1* | 3/2009 | Berry | G01R 31/2889 324/750.01 |
| 2009/0092177 A1 | 4/2009 | Dvorak et al. | |
| 2009/0129129 A1 | 5/2009 | Udagawa | |
| 2009/0272634 A1 | 11/2009 | Ehlers et al. | |
| 2009/0279673 A1 | 11/2009 | Maffre et al. | |
| 2010/0225301 A1 | 9/2010 | Nakayama et al. | |
| 2010/0228515 A1 | 9/2010 | Srinivasan et al. | |
| 2010/0309952 A1 | 12/2010 | Asami | |
| 2010/0312506 A1 | 12/2010 | Taylor | |
| 2011/0227767 A1 | 9/2011 | O'Brien | |
| 2012/0049655 A1 | 3/2012 | Leyendecker et al. | |
| 2012/0221279 A1 | 8/2012 | Zhang | |
| 2013/0006567 A1 | 1/2013 | Horn | |
| 2013/0179735 A1* | 7/2013 | Buckhurst | G01R 31/2834 714/35 |
| 2013/0229068 A1 | 9/2013 | Sanders, III et al. | |
| 2013/0234723 A1 | 9/2013 | Behrens et al. | |
| 2014/0114603 A1* | 4/2014 | Moon | G01R 31/31907 702/118 |
| 2016/0139968 A1* | 5/2016 | DeWitt | G06F 9/528 710/200 |

FOREIGN PATENT DOCUMENTS

| | | |
|---|---|---|
| EP | 1298778 | 4/2003 |
| JP | H11038087 | 2/1999 |
| JP | 2000009792 | 1/2000 |
| WO | 99/21025 | 4/1999 |
| WO | 2012/084028 | 6/2012 |
| WO | 2014/135194 | 9/2014 |

OTHER PUBLICATIONS

Lenk, F., et al., "A New Multiport Measurement-Method Using a Two-Port Network Analyzer," IEEE MTT-S International Microwave Symposium, Jun. 12-17, 2005, pp. 1663-1666.

Kam, D.G., et al., "Multiport Measurement Method Using a Two-Port Network Analyzer With Remaining Ports Unterminated," IEEE Microwave and Wireless Components Letters, vol. 17, No. 9, Sep. 2007, pp. 694-396.

Chen, C.-J., et al., "An Error Analysis of the Scattering Matrix Renormalization Transform," IEEE Transactions on Microwave Theory and Techniques, vol. 57, No. 4, Apr. 2009, pp. 863-868.

Rolfes, I., et al., "Multiport Method for the Measurement of the Scattering Parameters of N-Ports," IEEE Transactions on Microwave Theory and Techniques, vol. 53, No. 6, Jun. 2005, pp. 1990-1996.

Sismanoglou, P., et al., "Input Test Data Compression Based on the Reuse of Parts of Dictionary Entries: Static and Dynamic Approaches," IEEE Transactions on Computer-Aided Design of Integrated Circuits and Systems, vol. 32, No. 11, Nov. 2013, pp. 1762-1775.

White, H.E., "Printed English Compression by Dictionary Encoding," Proceedings of the IEEE, vol. 55, No. 3, Mar. 1967, pp. 390-396.

Ting, Shang-Kee et al., "An Algorithm to Compensate the Effects of Spurious PLL Tones in Spectrum Sensing Architectures", IEEE Transactions on Circuits and Systems, I: Regular Papers, vol. 59, No. 5, May 1, 2012, pp. 1093-1106.

Jamal, Shafiq M. et al., "Calibration of Sample-Time Error in a Two-Channel Time-Interleaved Analog-to-Digital Converter," IEEE Transactions on Circuits and Systems, I: Regular Papers, vol. 51, No. 1, Jan. 1, 2004, pp. 130-139.

Marple, S. Lawrence Jr., "Computing the Discrete-Time 'Analytic' Signal via FFT," IEEE Transactions on Signal Processing, vol. 47, No. 9, Sep. 1, 1999, pp. 2600-2603.

Liu, Lei, "Finite Automata for Evaluating Testbed Resource Contention," IEEE, Wireless Telecommunications Symposium WTS 2007, Piscataway, NJ, Apr. 26, 2007, pp. 1-6.

Nieuwoudt, I et al., "Algorithms for a Shared Resource Scheduling Problem in Which Some Level of Conflict is Tolerable," Journal of Scheduling, Kluwer Academic Publishers, vol. 15, No. 6, Sep. 29, 2012, pp. 681-702.

* cited by examiner

METHOD FOR OPERATING A TEST APPARATUS AND A TEST APPARATUS

CROSS-REFERENCE TO RELATED APPLICATIONS

This application is a continuation of copending International Application No. PCT/EP2015/057273, filed Apr. 1, 2015, which is incorporated herein by reference in its entirety.

BACKGROUND OF THE INVENTION

Embodiments of the present invention relate to a method for operating a test apparatus using shared resources and the corresponding apparatus. Further embodiments relate to virtual shared resources of virtual resource sharing.

Whenever hardware resources are shared, these are typically expensive and it is desirable to use them as efficiently as possible. In general, this is achieved by locking the resources for a certain period of usage, i.e. to serialize measurements either every time or never. As long as the shared resource is locked by a certain thread of execution, no other thread can use the resource even though, depending on the scenario, this may be possible. In software that locking is typically achieved in a multi-threaded environment with the help of a mutex object per shared resource. A second thread of execution which wants to use the shared resource concurrently will try to lock the mutex, and if another thread currently owns that shared resource, the concurrent thread will be blocked until the resource is freed by the first thread.

In more complex situations involving multiple shared resources, it may become requisite to lock multiple mutexes in a certain order to make sure no deadlocks arise in concurrent scenarios. Ensuring the same sequence of locking at all times ensures that no thread of execution owns resources required by the other and vice versa.

If the decision whether a set of resources can be used concurrently depends on setup parameters (e.g. because of a multisite scenario) then the pure locking cannot be applied anymore, but the software may analyze the scenario and decide which resources need to be locked and whether that is possible. Even worse, if two threads execute compatible scenarios (i.e. they can run concurrently) but still both need the shared resource, then they would block each other if simple locking as indicated above would be applied. Not locking the shared resource is not a valid solution in case there are other scenarios which actually do have a conflict with either of the compatible scenarios. The same applies to semaphores, which would allow multiple threads to lock the resource, but it cannot control which threads to give access to.

In other words, some hardware allows concurrent use of a shared resource in specific scenarios (i.e. under specific conditions) while at the same time it disallows using the same shared resource for scenarios with conflicting conditions. Making maximum use of the shared resource, it is advantageous to organize the sharing according to the scenarios.

SUMMARY

According to an embodiment, a method for operating a test apparatus having a plurality of shared resources, which can be used in different instruments, may have the steps of: blocking a first set of resource blockers when a first instrument, which requires a first subset of the shared resources, is to be executed; trying to block a second set of resource blockers, when a second instrument, which requires a second subset of the shared resources is to be executed, wherein the first set of resource blockers is different from the second set of resource blockers; and wherein a plurality of resource blockers are assigned to a shared resource, which is involved in a conflicting combination of instruments and in a non-conflicting combination of instruments.

Another embodiment may have a non-transitory digital storage medium having a computer program stored thereon to perform the method for operating a test apparatus having a plurality of shared resources, which can be used in different instruments, having the steps of: blocking a first set of resource blockers when a first instrument, which requires a first subset of the shared resources, is to be executed; trying to block a second set of resource blockers, when a second instrument, which requires a second subset of the shared resources is to be executed, wherein the first set of resource blockers is different from the second set of resource blockers; and wherein a plurality of resource blockers are assigned to a shared resource, which is involved in a conflicting combination of instruments and in a non-conflicting combination of instruments, when said computer program is run by a computer.

According to another embodiment, a test apparatus may have: a plurality of shared resources, which can be used in different instruments; wherein a first set of resource blockers is blocked when a first instrument, which requires a first subset of the shared resources, is to be executed; wherein it is tried to block a second set of resource blockers, when a second instrument, which requires a second subset of the shared resources to be executed, wherein the first set of resource blockers is different from the second set of resource blockers; and wherein a plurality of resource blockers are assigned to a shared resource, which is involved in a conflicting combination of instruments and a non-conflicting combination of instruments.

According to a first embodiment, a method for operating a test apparatus comprising a plurality of shared resources is shown, wherein the plurality of shared resources can be used in different scenarios by different instruments. The method comprises blocking a first set of resource blockers when a first instrument, which requires a first subset of the shared resources, is to be executed. Furthermore, the method tries to block a second set of resource blockers, when a second instrument, which requires a second subset of the shared resources, is to be executed. Therefore, the first set of resource blockers is different from the second set of resource blockers and a plurality of resource blockers are assigned to a shared resource, which is involved in a conflicting combination of instruments and in a non-conflicting combination of instruments.

Teachings disclosed herein are based on the fundamental idea that an appropriate blocking of shared resources ensures multiple use of the shared resource for scenarios or instruments which can be operated concurrently and single use of the shared resource if an instrument needs a shared resource exclusively. Therefore, multiple resource blockers may be assigned to the shared resources according to the conflicting and non-conflicting instruments or scenarios. When a thread executes a specific instrument or scenario, it locks for each affected shared resource all resource blockers associated with that instrument or scenario. The shared resource is thus virtually split into multiple resources, where a subset can be locked to exclude specific other instruments from execution. The mapping of the resource blockers can be done by different algorithms, for instance by definition of a scenario compatibility matrix, where each exclusion is represented by a number indexing into the list of resource blockers associated with a shared resource.

The term instrument relates to one or more resources (some of which may be shared between different instruments), which are (virtually) forming instruments, wherein a first instrument may comprise a first shared resource, a second instrument may comprise a second shared resource and a third and a fourth instrument may comprise a combination of the first and the second shared resource, e.g. using different amplifications or gains of one of the shared resources. However, the assignment is arbitrary and mutually applicable. Furthermore, a scenario comprises multiple instruments in a specific order. Therefore, instruments may use shared resources concurrently and scenarios may use either instruments or shared resources concurrently, where each concurrency may be conflicting or non-conflicting. If instruments use a shared resource concurrently, obviously, one or more scenarios comprising the instruments also use the shared resource concurrently. Therefore, the terms scenario and instrument are mutually applicable when referring to concurrent usage of shared resources.

Embodiments show the method executing a first test program portion (e.g. a thread) configured to operate (i.e. use) the first instrument. The test program portion comprises checking a first set of resource blockers associated with the first instrument, blocking the first set of resource blockers if none of the resource blockers of the first set of resource blockers are blocked, and selectively performing a test using a tester configuration defined by the first instrument, if it was found in the checking step that none of the resource blockers of the first set of resource blockers are blocked. Furthermore, a second test program portion configured to operate the second instrument is executed. The second test program portion comprises checking a second set of resource blockers associated with a second instrument, blocking the second set of resource blockers if none of the resource blockers of the second set of resource blockers are blocked, and selectively performing a test using a tester configuration defined by the second instrument if it was found in the checking step that none of the resource blockers of the second set of resource blockers are blocked. The second test program portion is executed concurrently with the first test program portion or with a temporal overlap with the first test program portion. In other words, a shared resource may be executed concurrently with another shared resource under a first condition, but under a second condition, the test program needs exclusive access to one of the shared resources. This is advantageous, since an instrument-based (i.e. context-based) usage of shared resources can significantly reduce the execution time of the whole test program. If more than one scenario is performed concurrently, a scenario-based usage may even improve the instrument-based usage.

According to a further embodiment, the method comprises waiting and checking the second set of resource blockers again if one of the resource blockers in the relevant subset is blocked or the method comprises executing a further part of the second test program portion and checking a second set of resource blockers again after the execution of the further part is finished. This is advantageous, since a current test program is further executed if a currently requested resource is blocked. If it is not possible to further execute the test program portion, the method waits until the relevant shared resources for the test program portion are unblocked and further executes the test program portion accordingly.

Embodiments further show the method comprising four different instruments, wherein the first and the second instrument constitute a non-conflicting combination of instruments using the first and the second subset of shared resources, respectively, and wherein a third and a fourth instrument constitute a non-conflicting combination of instruments using both a combination of the first and the second subset of shared resources. Therefore, the first and the second instrument are each in a conflict to both the third and the fourth instrument.

The method further comprises four different resource blockers, wherein each of the resource blockers is assigned to one virtual shared resource. A first and a second virtual shared resource are assigned to the first shared resource and a third and a fourth virtual shared resource are assigned to the second shared resource. The first set of resource blockers comprises the first and the second virtual shared resource, the second set of resource blockers comprises the third and the fourth virtual shared resource, a third set of resource blockers comprises the first and the third virtual shared resource, and a fourth set of resource blockers comprises the second and the fourth virtual shared resource. According to the first and the second test program portion, the method executes a third test program portion configured to operate the third instrument. The third test program portion comprises checking the third set of resource blockers associated with a third instrument, blocking the third set of resource blockers if none of the resource blockers in the third set of resource blockers are blocked, and selectively performing a test using a tester configuration defined by the third instrument if it was found in the checking step that none of the resource blockers in the third set of resource blockers are blocked.

Accordingly, a fourth test program portion configured to operate the fourth instrument is executed. The fourth test program portion comprises checking the fourth set of resource blockers associated with the fourth instrument, blocking the fourth set of resource blockers if none of the resource blockers of the fourth set of resource blockers are blocked, and selectively performing a test using a tester configuration defined by the fourth instrument, if it was found in the checking step that none of the resource blockers in the fourth set of resource blockers are blocked. At least two of the first, the second, the third, and the fourth test program portions are executed concurrently or with a temporal overlap to one another. This is again advantageous in terms of an execution time of the test program since, in this case, four different test program portions are optimized in terms of accessing two different shared resources.

According to an embodiment, the resource blockers are a bit or a plurality of bits in a storing unit to indicate a usage of the shared resources. This is advantageous, since multiple bits are assigned to a shared resource, indicating instruments where a shared resource may be used concurrently. The resource blocker may be further implemented as a mutex, a semaphore, a lock or a monitor.

According to embodiments, one of the instruments is a virtual device configured to use a signal which is based on one of the shared resources or configured to generate a signal which is based on a combination of signals of multiple shared resources. For example, this is a one-tone generator using one of the shared resources or a two-tone generator using a combination of two of the shared resources.

Moreover, multiple instruments may be operated in one or more scenarios. Therefore, the description referring to instruments may be also applied to scenarios.

Further embodiments show the shared resource as a physical stimulus device. The shared resource may be a signal generator to generate a stimulus signal, which may be an analog stimulus signal, wherein the stimulus signal is e.g. a radio frequency signal. According to another embodiment, the shared resource is a digital to analog converter. The speed of the analog to digital conversion depends on parameters like sampling rate and/or resolution (or quantization) of the digital inbound signal. Therefore, it is advantageous to use the digital to analog converter concurrently, for example for two different digital inbound signals and two different instruments.

The previously described method may be implemented in a computer program to run on a computer.

Furthermore, an embodiment shows a test apparatus comprising a plurality of shared resources which can be used in different instruments. Furthermore, the test apparatus comprises a method for operating the test apparatus comprising blocking a first set of resource blockers when a first instrument, which requires a first subset of the shared resources, is to be executed, trying to block a second set of resource blockers, when a second instrument, which requires a second subset of the shared resources is to be executed, wherein the first set of resource blockers is different from the second set of resource blockers, and wherein a plurality of resource blockers are assigned to a shared resource, which is involved in a conflicting combination of instruments and a non-conflicting combination of instruments.

BRIEF DESCRIPTION OF THE DRAWINGS

Embodiments of the present invention will be detailed subsequently referring to the appended drawings, in which.

DETAILED DESCRIPTION OF THE INVENTION

Embodiments of the present invention will be discussed in detail below, wherein identical reference numbers are provided to objects having identical or similar functions, so that the description thereof is interchangeable or mutually applicable.

Figure 1:
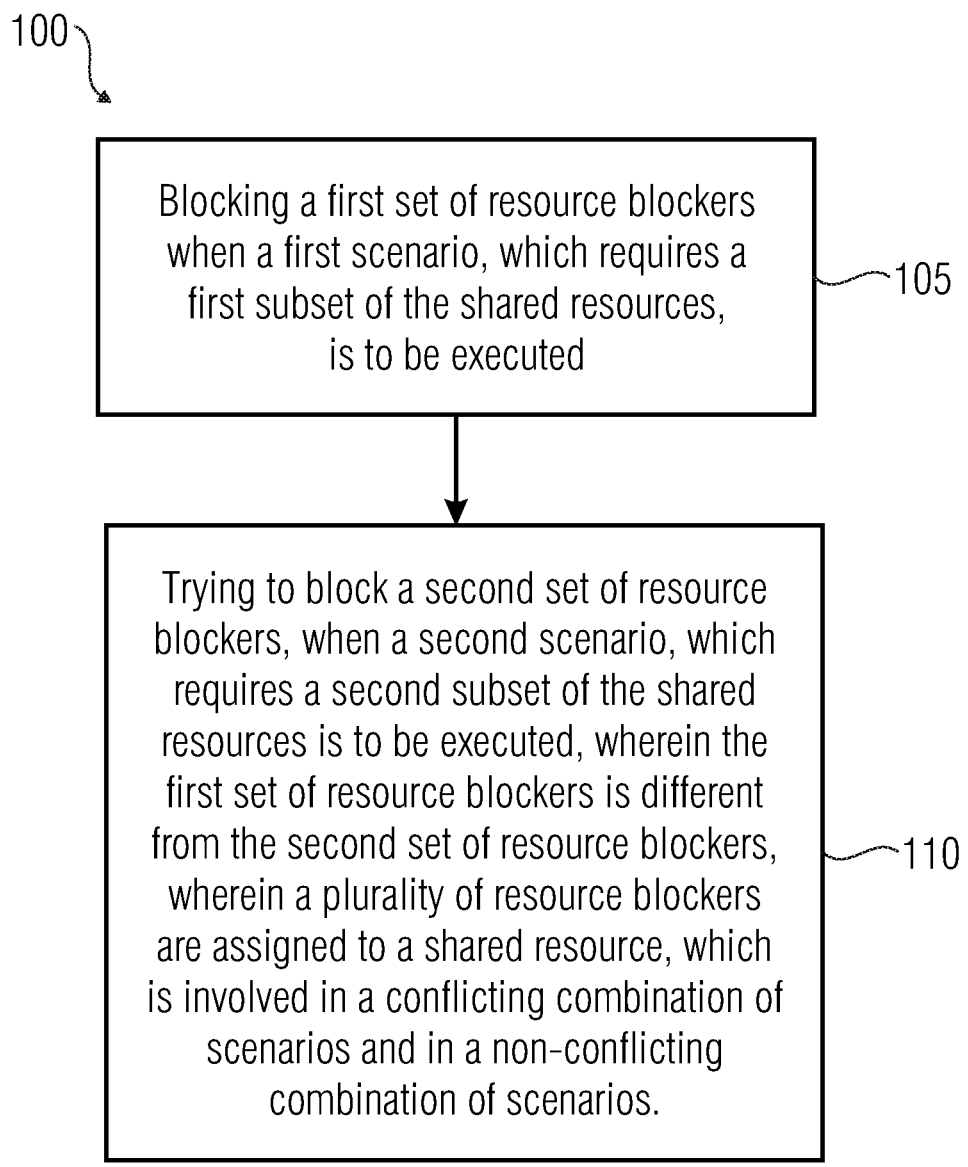
FIG. 1 shows a schematic block diagram of a method for operating a test apparatus.

FIG. 1 shows a schematic block diagram 100 of a method for operating a test apparatus comprising a plurality of shared resources, which can be used in different instruments. The method comprises blocking a first set of resource blockers when a first instrument, which requires a first subset of the shared resources, is to be executed in a step 105, and trying to block a second set of resource blockers, when a second instrument, which requires a second subset of the shared resources is to be executed, wherein the first set of resource blockers is different from the second set of resource blockers in a step 110. Therefore, a plurality of resource blockers are assigned to a shared resource, which is involved in a conflicting combination of instruments and in a non-conflicting combination of instruments.

A resource blocker may be a bit or a plurality of bits in a storing unit to indicate a usage of the shared resources. In a practical application, a mutex, a semaphore, a lock or a monitor may be used, which are already pre-implemented as functions in many high level programming languages. A schematic and exemplary assignment of resource blockers to instruments and shared resources is shown in FIG. 4. The shared resources and the instruments are explained with respect to FIGS. 2 and 3.

The term "trying to block" a set of resource blockers refers to checking in a first step whether the resource blockers are already blocked, and blocking the resource blockers if they are not already blocked. If the resource blockers are already blocked, it may be waited until the resource blockers are unblocked or it may be executed a further instrument meanwhile.

A "different" set of resource blockers indicates at least one resource blocker which is different in the first set of resource blockers compared to the second set of resource blockers. A different set of resource blockers is, for example, if the first set of resource blockers comprises a first and a second resource blocker, and the second set of resource blockers comprises only the first resource blocker, or alternatively the first and a third resource blocker.

Figure 2:
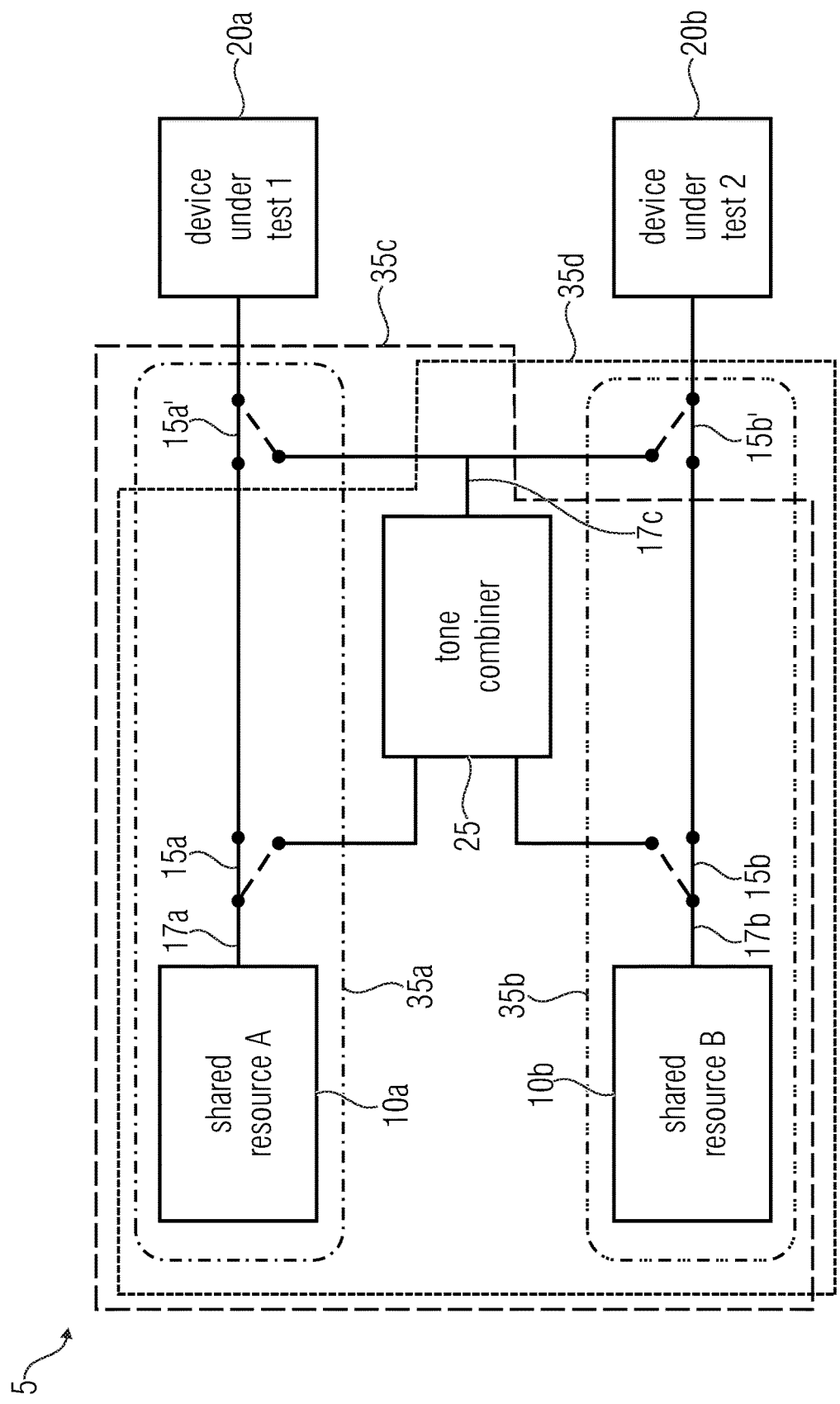
FIG. 2 shows a schematic block diagram of a test apparatus, which may be operated by the method shown in FIG. 1.

FIG. 2 shows a schematic block diagram of a test apparatus 5, which may be operated by the method 100 shown in FIG. 1. The test apparatus comprises a shared resource A (SR-A) 10a and a shared resource B (SR-B) 10b. Switches 15a, 15a', 15b, 15b' are configured to provide a stimulus signal 17a, b of the shared resources directly to a first and/or a second device under test 20a, 20b, or alternatively to provide a combined signal 17c to the first and/or the second device under test 20a, 20b, wherein the combined signal 17c is a combination of the stimulus signal 17a, b of the shared resources combined by a tone combiner 25. In other words, the output of the tone-combiner 17c may be routed back to both device under test (DUT) connections 17a, 17b and corresponding switches 15a, 15a', 15b, 15b' can then be used to select the path through the tone-combiner or individual paths beneath it. Thus, the shared resources can operate as either two single-tone instruments or virtually two dual-tone instruments. The (virtually) different instruments 35a-d, are indicated by the corresponding frames. Using the method 100, the test apparatus 5 is configured to operate multiple instruments using the shared resources.

In a more general case, the term "instrument" can be replaced with the term "scenario", wherein a scenario comprises one or more instruments. Both, the scenario and the instruments, may comprise a plurality of shared resources in multiple combinations, i.e. stimuli and/or measurement devices. Both will be described with respect to FIG. 3. Assuming that instruments in the tester (short for test apparatus) have shared resources 10a, b, which however may sometimes still be used concurrently. Each combination of instruments to be used concurrently from multiple threads despite the shared resources should not try to lock the same mutexes (or shared resources) while instruments or scenarios wherein exclusive access of a shared resource is required, have to lock at least one mutex overlapping with the conflicting instruments.

According to an embodiment, the system provides four distinct instruments using two shared resources SR-A and SR-B. Instrument 1 uses SR-A only, instrument 2 uses SR-B only, and instrument 3 and instrument 4 use both shared resources SR-A and SR-B. The instruments 1 and 2 may describe two single source radio frequency stimuli and the instruments 3 and 4 may describe two dual source radio frequency stimuli. Instruments 1 and 2 are certainly usable concurrently, since they do not share resources. Furthermore, instruments 3 and 4 should be usable concurrently (in the radio frequency case special care is taken that this happens only with compatible settings for the dual tone). However, it will not be possible to use instrument 1 or 2 concurrently with instrument 3 or 4, since the routing of signals from the sources either goes through the tone combiner 25 or it does not.

A shared resource 10a or 10b may be a physical input/output device like, e.g. a signal generator to generate an analog stimulus signal 17a, 17b, which may be a radio frequency signal, or a measurement device. According to a further embodiment, the shared resources 10a, 10b may be digital to analog converters configured to convert a digital inbound signal to the analog outbound signal 17a, 17b, e.g. to be used as a stimulus signal for a device under test. The speed of the analog to digital conversion depends on parameters like sampling rate and/or resolution (or quantization) of the digital inbound signal. Therefore, at least one of the digital to analog converters may be used concurrently, for example for two different digital inbound signals and two different instruments, if e.g. the settings allow a digital to analog conversion which is twice as fast as a further signal processing. In this case, a converted signal may be temporarily stored in a storing unit (or a buffer), e.g. a (flash) memory and further processed from the storing unit.

The idea of how to cope with the instrument-based differentiation of a concurrent or an exclusive use of a shared resource is to virtually split the shared resources 10a, 10b into virtual shared resources. According to the previously described embodiment, a shared resource A is split into a virtual shared resource A1 and a virtual shared resource A2, and a shared resource B is split into a virtual shared resource B1 and a virtual shared resource B2. From now on, simple locking as described in FIG. 4 can achieve exactly the desired behavior. Since instrument 3 and instrument 4 should be able to run concurrently despite their shared resources, they each lock half the resources, i.e. only one out of two associated virtual resources. Furthermore, instrument 1 and instrument 2 require exclusive access to shared resource A and shared resource B, respectively, and therefore lock both virtual shared resources, i.e. the complete shared resource.

This mechanism is universally applicable whenever two instruments should run concurrently even though they make use of the same resources. For each such case, the affected resources need to provide duplicated locks and only half the locks are taken in each instrument. The instruments which should still be locked out from concurrency will simply lock all resources.

Figure 3:
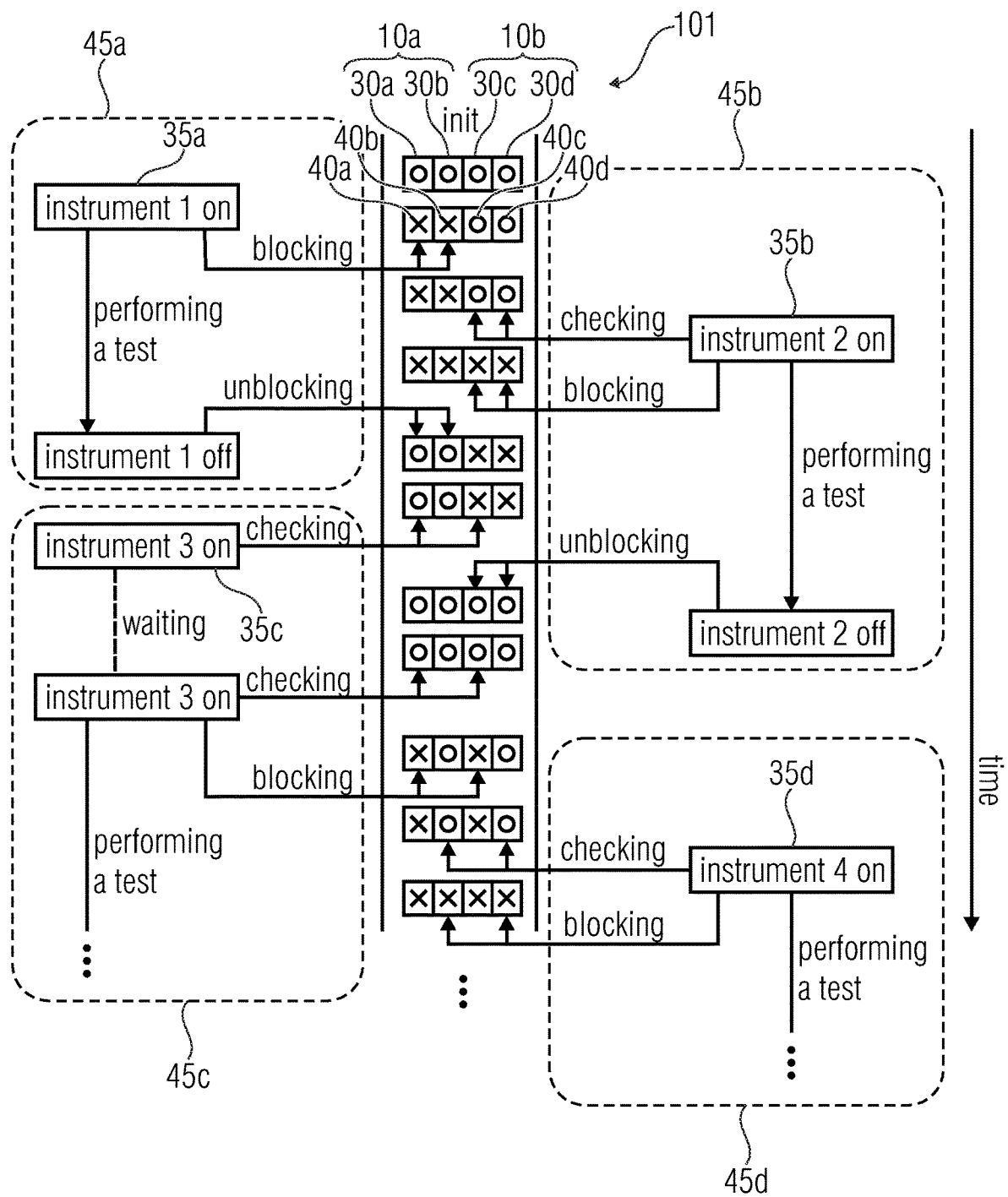
FIG. 3 shows a schematic sequence diagram illustrating an exemplary scenario of the method shown in FIG. 1.
Figure 4:
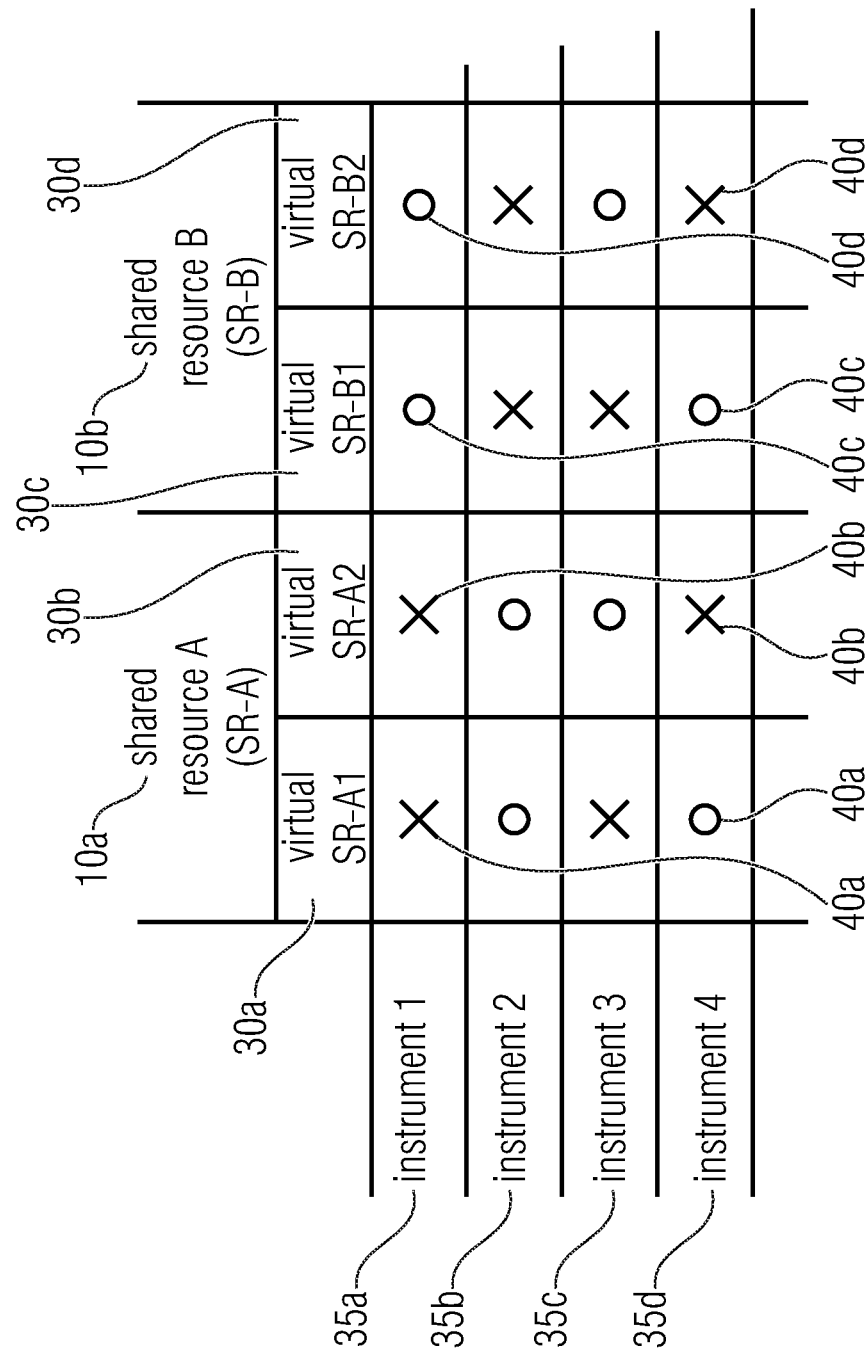
FIG. 4 shows a schematic table indicating the allocations of shared and virtual shared resources to corresponding instruments.

FIG. 3 shows a schematic sequence diagram illustrating an exemplary scenario 101 of the method 100. To better illustrate the plurality of certain steps (or instruments) of the method 100, these steps are aligned on the left and the right hand side of the resource blockers 30a to 30d in the middle of the diagram. The resource blocker 30a refers to the virtual resource SR-A1, 30b refers to the virtual resource SR-A2, 30c refers to the virtual resource SR-B1, and 30d refers to the virtual resource SR-B2. The method starts by executing instrument 1 35a. A checking step may optionally be implemented to check the relevant virtual shared resources SR-A1 and SR-A2 30a, 30b. This is optional since the resource blockers are initially not blocked in this specific scenario. In general, the nature of (multi-threaded) concurrent execution implies that the individual scenario cannot know whether it gets executed first. Before selectively performing a test using a tester configuration defined by the first instrument, the first set of resource blockers 40a, 40b, belonging to the virtual shared resources 30a and 30b, are blocked. While a test using the configuration of instrument 1 is performed, a test using the configuration of instrument 2 35b is to be executed. In a further step, the set of resource blockers 40c, 40d is relevant to the second instrument 35b checked with respect to the state (blocked or unblocked) of the resource blockers 40c, 40d. If none of the checked resource blockers are blocked, the test program blocks these resource blockers. Thereafter, the test using instrument 2 is performed.

While the test using instrument 2 is running, the test using instrument 1 is finished. Therefore, the test program unblocks the relevant resource blockers 40a, 40b to indicate that shared resource A 10a is free.

A further test program portion is trying to perform a test using instrument 3. In a first step, the relevant resource block 40a, 40c are checked. In this case, instrument 2 still blocks the resource blocker of the virtual resource SR-B1 40c implying that the test using instrument 3 cannot be executed at that moment. As indicated in FIG. 3, the test program may simply wait for the second instrument to finish or, not shown in FIG. 3, a further test program portion may be executed meanwhile, if possible. However, once the checking of instrument 3 is positive (because the test program running instrument 2 unblocked the resource blockers 40c and 40d), the relevant resource blockers 40a and 40c are blocked and a test according to instrument 3 35c is performed. Parallel to instrument 3 35c, instrument 4 35d may be operated.

Although this scenario is exemplary and shall not limit the generality, it shows that the shared resources A and B, 10a, 10b can run concurrently in those instruments where concurrency is possible. However, if instruments block each other, an instrument trying to access a shared resource which is already blocked needs to wait for execution at least until the resource blocker is freed.

Introducing a mapping from instrument (or scenario) based decisions of what may run concurrently and what not to basic synchronization mechanism makes the solution more easily portable and less deadlock prone than conventional point solutions. The embodiment virtually splits the locks associated with shared resources and assigns each instrument, which should still own their shared resource exclusively over all other instruments, the whole set of locks, while instruments that should run concurrently with each other will be assigned only a subset of locks. Thus, after this mapping is applied the problem is reduced to simple serial locking of all assigned locks. Therefore, it may be defined a sequence of locking which is executed in the same order to avoid deadlocks FIG. 4 shows a schematic table indicating the allocations of shared and virtual shared resources 10a, b and 30a-d to the corresponding instruments 35a-d. An X indicates a blocking of the resource block and an O indicates an unblocked resource blocker.

As is stated clearly, this mechanism is universally applicable whenever two instruments should run concurrently even though they make use of the same resources. For each such case, the affected resources need to provide duplicated locks (resource blockers) and only half the locks will be taken in each instrument. The instruments which should still be locked out from concurrency will simply lock all virtual shared resources.

Depending on certain implementation requirements, embodiments of the invention can be implemented in hardware or in software. The implementation can be performed using a digital storage medium, for example a floppy disc, a DVD, a Blu-Ray, a CD, a ROM, a PROM, and EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive method is, therefore, a data carrier (or a non-transitory storage medium such as a digital storage medium, or a computer-readable medium) comprising, recorded thereon, the computer program for performing one of the methods described herein. The data carrier, the digital storage medium or the recorded medium are typically tangible and/or non-transitory.

A further embodiment of the invention method is, therefore, a data stream or a sequence of signals representing the computer program for performing one of the methods described herein. The data stream or the sequence of signals may, for example, be configured to be transferred via a data communication connection, for example, via the internet.

A further embodiment comprises a processing means, for example, a computer or a programmable logic device, configured to, or adapted to, perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method for operating a test apparatus, the method comprising:
    creating a plurality of instruments by selecting at least one shared resource from a plurality of shared resources to operate as a respective instrument of the plurality of instruments;
    assigning respective selections of a plurality of resource blockers, which indicate usage of a shared resource by at least one instrument and whether usage of the shared resource by an additional instrument is permitted, to a respective shared resource of the plurality of shared resources with different types of use modes including useable in an exclusive mode by an instrument of a first group of the plurality of instruments and useable in a non-exclusive and concurrent mode by multiple instruments of a second group of the plurality of instruments;
    using the resource blockers assigned to the shared resources to control execution of the plurality of instruments by configuring the different types of use modes of the shared resources associated with the plurality of instruments to avoid conflicts among the shared resources;
    blocking a first set of the resource blockers to selectively lock usage of the respective shared resources by other instruments if a first instrument, which comprises a first selected subset of the shared resources, is to be executed, wherein said blocking includes, based on a type of use mode resulting from the first set and the first selected subset, performing one of blocking the respective selections of the resource blockers assigned individually to the shared resources of the first selected subset to lock the other instruments or blocking a subset of the respective selections of the resource blockers assigned individually to the shared resources of the first selected subset to lock a portion of the other instruments; and
    determining whether a second set of the resource blockers can be blocked if a second instrument, which comprises a second selected subset of the shared resources, is to be executed and if it is unknown whether types of use modes associated with the first set and the second set conflict, wherein the first set of the resource blockers is different from the second set of the resource blockers.

2. The method according to claim 1, further comprising:
    executing a first test program portion configured to operate the first instrument, wherein
    said executing the first test program portion comprises:
        checking the first set of the resource blockers associated with the first instrument, blocking the first set of the resource blockers if the resource blockers of the first set are not blocked, and
        selectively performing a first test using a first tester configuration defined by the first instrument if the resource blockers of the first set are not blocked;
    executing a second test program portion configured to operate the second instrument,
    wherein said executing the second test program portion comprises:
        checking the second set of the resource blockers associated with the second instrument,
        blocking the second set of the resource blockers if the resource blockers of the second set are not blocked, and selectively performing a second test using a second tester configuration defined by the second instrument if the resource blockers of the second set are not blocked;

wherein said executing the second test program portion is performed in at least one of concurrently with said executing the first test program portion or with a first temporal overlap with said executing the first test program portion.

3. The method according to claim 2, further comprising: at least one of if at least one of the resource blockers of the second set is blocked, waiting a period of time and re-checking the second set of the resource blockers; or if at least one of the resource blockers of the second set is blocked, executing a further part of the second test program portion and re-checking the second set of the resource blockers after the execution of the further part is finished.

4. The method according to claim 2, further comprising:

executing a third test program portion configured to operate a third instrument, wherein said executing the third test program portion comprises:

checking a third set of the resource blockers associated with the third instrument, blocking the third set of the resource blockers if the resource blockers of the third set are not blocked, and selectively performing a third test using a third tester configuration defined by the third instrument if the resource blockers of the third set are not blocked; and executing a fourth test program portion configured to operate a fourth instrument, wherein said executing the fourth test program portion comprises:

checking a fourth set of the resource blockers associated with the fourth instrument, blocking the fourth set of the resource blockers if the resource blockers of the fourth set are not blocked, and selectively performing a fourth test using a fourth tester configuration defined by the fourth instrument if the resource blockers of the fourth set are not blocked;

wherein at least two of said executing the first, said executing the second, said executing the third, or said executing the fourth test program portions are performed in at least one of concurrently with one another or with a second temporal overlap with one another.

5. The method according to claim 2, wherein said assigning the respective selections comprises:

assigning a respective number of a plurality of virtual shared resources to the respective shared resource of the plurality of shared resources;

assigning at least one of the respective selections of the resource blockers of the respective shared resource of the plurality of shared resources to the respective number of the virtual shared resources of the respective shared resource of the plurality of shared resources; and controlling access of the instruments to the shared resources with the resource blockers and the virtual shared resources.

6. The method according to claim 2, wherein the first and second instruments are operable to use the first and second selected subsets of the shared resources in the exclusive mode, and wherein a third and fourth instruments are operable to use the first and second selected subsets of the shared resources in the non-exclusive and concurrent mode.

7. The method according to claim 6, further comprising:

assigning first and second virtual shared resources to a first shared resource;

assigning third and fourth virtual shared resources to a second shared resource; and assigning at least one of the respective selections of the resource blockers of the first shared resource and of the second shared resource to the first and second virtual shared resources and the third and fourth virtual shared resources, respectively.

8. The method according to claim 7, wherein the first set of the resource blockers corresponds to the first and second virtual shared resources, and wherein the second set of the resource blockers corresponds to the third and fourth virtual shared resources.

9. The method according to claim 8, wherein a third set of the resource blockers corresponds to the first and third virtual shared resources, and wherein a fourth set of the resource blockers corresponds to the second and fourth virtual shared resources.

10. The method according to claim 1, wherein an individual resource blocker of the resource blockers comprises at least one of a bit or a plurality of bits in a storing unit to indicate a usage of the respective shared resource.

11. The method according to claim 1, wherein the resource blockers comprise at least one of mutexes, semaphores, locks, or monitors.

12. The method according to claim 1, wherein one of the instruments comprises at least one of a virtual device configured to use a signal which is based on one of the shared resources or a virtual device configured to generate a signal which is based on a combination of signals of multiple shared resources.

13. The method according to claim 1, wherein a set of the instruments are used concurrently.

14. The method according to claim 1, wherein one of the instruments comprises at least one of a one tone generator using one of the shared resources or a two tone generator using a combination of two of the shared resources.

15. The method according to claim 1, wherein the shared resources comprise a physical stimulus device.

16. The method according to claim 1, wherein the shared resources comprise a signal generator to generate a stimulus signal.

17. The method according to claim 1, wherein the shared resources comprise a signal generator to generate radio frequency signals.

18. The method according to claim 1, wherein the shared resources comprise a plurality of digital to analog converters.

19. A non-transitory digital storage medium having a computer program stored thereon to perform a method for operating a test apparatus, the method comprising:

creating a plurality of instruments by selecting at least one shared resource from a plurality of shared resources to operate as a respective instrument of the plurality of instruments;

assigning respective selections of a plurality of resource blockers, which indicate usage of a shared resource by at least one instrument and whether usage of the shared resource by an additional instrument is permitted, to a respective shared resource of the plurality of shared resources with different types of use modes including useable in an exclusive mode by an instrument of a first group of the plurality of instruments and useable in a non-exclusive and concurrent mode by multiple instruments of a second group of the plurality of instruments;

using the resource blockers assigned to the shared resources to control execution of the plurality of instruments by configuring the different types of use modes of the shared resources associated with the plurality of instruments to avoid conflicts among the shared resources;

blocking a first set of the resource blockers to selectively lock usage of the respective shared resources by other instruments if a first instrument, which comprises a first selected subset of the shared resources, is to be executed, wherein said blocking includes, based on a type of use mode resulting from the first set and the first selected subset, performing one of blocking the respective selections of the resource blockers assigned individually to the shared resources of the first selected subset to lock the other instruments or blocking a subset of the respective selections of the resource blockers assigned individually to the shared resources of the first selected subset to lock a portion of the other instruments; and determining whether a second set of the resource blockers can be blocked if a second instrument, which comprises a second selected subset of the shared resources, is to be executed and if it is unknown whether types of use modes associated with the first set and the second set conflict, wherein the first set of the resource blockers is different from the second set of the resource blockers.

20. A test apparatus comprising:

a plurality of shared resources with different types of use modes;

a plurality of instruments created by selection of at least one shared resource from the shared resources to operate as a respective instrument of the plurality of instruments; and a plurality of resource blockers, which indicate usage of a shared resource by at least one instrument and whether usage of the shared resource by an additional instrument is permitted, wherein respective selections of the resource blockers are assigned to a respective shared resource of the plurality of shared resources, wherein the resource blockers assigned to the shared resources are usable to control execution of the plurality of instruments by configuring the different types of use modes of the shared resources associated with the plurality of instruments to avoid conflicts among the shared resources;

wherein the different types of use modes include useable in an exclusive mode by an instrument of a first group of the instruments and useable in a non-exclusive and concurrent mode by multiple instruments of a second group of the instruments;

wherein a first set of the resource blockers is blocked to selectively lock usage of the respective shared resources by other instruments if a first instrument, which comprises a first selected subset of the shared resources, is to be executed, by causing, based on a type of use mode resulting from the first set and the first selected subset, either the respective selections of the resource blockers assigned individually to the shared resources of the first selected subset to be blocked to lock the other instruments or a subset of the respective selections of the resource blockers assigned individually to the shared resources of the first selected subset to be blocked to lock a portion of the other instruments; and wherein a determination is made whether a second set of the resource blockers can be blocked if a second instrument, which comprises a second selected subset of the shared resources, is to be executed and if it is unknown whether types of use modes associated with the first set and the second set conflict, wherein the first set of the resource blockers is different from the second set of the resource blockers.

* * * * *